United States Patent
Iyechika et al.

(10) Patent No.: US 10,204,819 B2
(45) Date of Patent: Feb. 12, 2019

(54) VAPOR PHASE GROWTH APPARATUS AND RING-SHAPED HOLDER HAVING A CURVED MOUNTING SURFACE WITH CONVEX AND CONCAVE REGIONS

(71) Applicant: NuFlare Technology, Inc., Kanagawa (JP)

(72) Inventors: Yasushi Iyechika, Matsudo (JP); Masayuki Tsukui, Yokohama (JP); Yoshitaka Ishikawa, Yokohama (JP)

(73) Assignee: NuFlare Technology, Inc., Kanagawa (JP)

( * ) Notice: Subject to any disclaimer, the term of this patent is extended or adjusted under 35 U.S.C. 154(b) by 0 days.

(21) Appl. No.: 15/789,654

(22) Filed: Oct. 20, 2017

(65) Prior Publication Data

US 2018/0114715 A1  Apr. 26, 2018

(30) Foreign Application Priority Data

Oct. 25, 2016  (JP) .................................. 2016-208600

(51) Int. Cl.
 *C30B 25/12* (2006.01)
 *H01L 21/687* (2006.01)
 (Continued)

(52) U.S. Cl.
 CPC ........ *H01L 21/68735* (2013.01); *C30B 25/10* (2013.01); *C30B 25/12* (2013.01); *C30B 25/18* (2013.01); *C30B 29/403* (2013.01); *C30B 29/406* (2013.01); *C30B 29/68* (2013.01); *H01L 21/0254* (2013.01); *H01L 21/0262* (2013.01);
 (Continued)

(58) Field of Classification Search
 CPC ......... C30B 25/00; C30B 25/02; C30B 25/10; C30B 25/12; C30B 25/16; C30B 25/165; C30B 25/18; C30B 29/403; C30B 29/406; C30B 29/68; C30B 31/00; C30B 31/06; C30B 31/14; H01L 21/02381; H01L 21/02433; H01L 21/02458; H01L 21/0254; H01L 21/0262; H01L 21/02658; H01L 21/67103; H01L 21/68764;
 (Continued)

(56) References Cited

U.S. PATENT DOCUMENTS 6,113,702 A * 9/2000 Halpin ................ C23C 16/4586
                                                        118/500
2015/0011077 A1   1/2015 Yamada et al.

FOREIGN PATENT DOCUMENTS

JP   2001-508599   6/2001
JP   2010-219225   9/2010
(Continued)

*Primary Examiner* — Kenneth A Bratland, Jr.
(74) *Attorney, Agent, or Firm* — Rankin, Hill & Clark LLP (57) ABSTRACT

A vapor phase growth apparatus according to an embodiment includes a reaction chamber, a ring-shaped holder provided in the reaction chamber, the ring-shaped holder configured to hold a substrate, the ring-shaped holder including an outer portion having ring-shape and an inner portion having ring-shape, the inner portion including a substrate mounting surface positioned below an upper surface of the outer portion, the substrate mounting surface being a curved surface, the curved surface having convex regions and concave regions repeated in a circumferential direction, the curved surface having six-fold rotational symmetry, and a heater provided below the ring-shaped holder.

13 Claims, 9 Drawing Sheets

(51) Int. Cl.
   *H01L 21/02*   (2006.01)
   *H01L 21/67*   (2006.01)
   *C30B 25/10*   (2006.01)
   *C30B 25/18*   (2006.01)
   *C30B 29/40*   (2006.01)
   *C30B 29/68*   (2006.01)
   *H01L 33/00*   (2010.01)
   *H01L 33/06*   (2010.01)
   *H01L 33/12*   (2010.01)
   *H01L 33/32*   (2010.01)

(52) U.S. Cl.
   CPC .. *H01L 21/02381* (2013.01); *H01L 21/02433* (2013.01); *H01L 21/02458* (2013.01); *H01L 21/02658* (2013.01); *H01L 21/67103* (2013.01); *H01L 21/68764* (2013.01); *H01L 33/007* (2013.01); *H01L 33/06* (2013.01); *H01L 33/12* (2013.01); *H01L 33/32* (2013.01)

(58) Field of Classification Search
   CPC ......... H01L 21/68714; H01L 21/68735; H01L 33/007; H01L 33/06; H01L 33/12; H01L 33/32
   USPC ................ 117/200, 204; 118/715, 720, 722, 118/724–725, 728–730
   See application file for complete search history.

(56) References Cited

FOREIGN PATENT DOCUMENTS

| | | |
|---|---|---|
| JP | 2015-195259 | 11/2015 |
| TW | 201306167 A | 2/2013 |
| TW | 201510269 A | 3/2015 |

\* cited by examiner

VAPOR PHASE GROWTH APPARATUS AND RING-SHAPED HOLDER HAVING A CURVED MOUNTING SURFACE WITH CONVEX AND CONCAVE REGIONS

CROSS-REFERENCE TO RELATED APPLICATION

This application is based upon and claims the benefit of priority from Japanese Patent Applications No. 2016-208600, filed on Oct. 25, 2016, the entire contents of which are incorporated herein by reference.

FIELD OF THE INVENTION

The present invention relates to a vapor phase growth apparatus, a ring-shaped holder, and a vapor phase growth method.

BACKGROUND OF THE INVENTION

As a method for forming a high-quality semiconductor film, there is an epitaxial growth technique which grows a single-crystal film on a substrate, such as a wafer, using vapor phase growth. In a vapor phase growth apparatus using the epitaxial growth technique, a wafer is placed on a support portion in a reaction chamber which is maintained at atmospheric pressure or reduced pressure.

Then, process gas, such as source gas which will be a raw material for forming a film, is supplied from an upper part of the reaction chamber to the surface of the wafer in the reaction chamber while the wafer is being heated. For example, the thermal reaction of the source gas occurs at the surface of the wafer and an epitaxial single-crystal film is formed on the surface of the wafer.

The characteristics of the epitaxial single-crystal film formed on the surface of the wafer depend on the temperature of the wafer. Therefore, it is preferable to improve the uniformity of the temperature at the surface of wafer.

JP2015-195259 discloses a vapor phase growth apparatus including a susceptor having substrate support portions. The substrate support portions positioned at the vertices of a hexagon.

SUMMARY OF THE INVENTION

A vapor phase growth apparatus according to an aspect of the invention includes: a reaction chamber; a ring-shaped holder provided in the reaction chamber, the ring-shaped holder configured to hold a substrate, the ring-shaped holder including an outer portion having ring-shape and an inner portion having ring-shape, the inner portion including a substrate mounting surface positioned below an upper surface of the outer portion, the substrate mounting surface being a curved surface, the curved surface having convex regions and concave regions repeated in a circumferential direction, the curved surface having six-fold rotational symmetry; and a heater provided below the ring-shaped holder.

A ring-shaped holder according to another aspect of the invention includes: an outer portion having ring-shape; and an inner portion having ring-shape, the inner portion having a substrate mounting surface positioned lower than an upper surface of the outer portion, the substrate mounting surface being a curved surface, the curved surface having convex regions and concave regions repeated in a circumferential direction, and the curved surface having six-fold rotational symmetry.

A vapor phase growth method according to still another aspect of the invention includes: placing a silicon substrate having a {111} face on a ring-shaped holder including an outer portion having ring-shape and an inner portion having ring-shape, the inner portion including a substrate mounting surface positioned below an upper surface of the outer portion, the substrate mounting surface being a curved surface, the curved surface having convex regions and concave regions repeated in a circumferential direction, the curved surface having six-fold rotational symmetry, the silicon substrate placed on the ring-shaped holder such that a <1-10> direction of the silicon substrate is aligned with a direction connecting the convex regions facing each other or a direction connecting the concave regions facing each other; heating the silicon substrate using a heater provided below the ring-shaped holder; and forming a film on the silicon substrate.

DETAILED DESCRIPTION OF THE EMBODIMENTS

Hereinafter, embodiments of the invention will be described with reference to the drawings.

In the specification, in some cases, the same or similar members are denoted by the same reference numerals.

In the specification, the direction of gravity in a state in which a vapor phase growth apparatus is provided so as to form a film is defined as a "lower" direction and a direction opposite to the direction of gravity is defined as an "upper" direction. Therefore, a "lower portion" means a position in the direction of gravity relative to the reference and a "lower side" means the direction of gravity relative to the reference. In addition, an "upper portion" means a position in the direction opposite to the direction of gravity relative to the reference and an "upper side" means the direction opposite to the direction of gravity relative to the reference. Furthermore, a "longitudinal direction" is the direction of gravity.

In the specification, "process gas" is a general term of gas used to form a film on a substrate. The concept of the "process gas" includes, for example, source gas, carrier gas, and diluent gas.

First Embodiment

A vapor phase growth apparatus according to this embodiment includes: a reaction chamber; a ring-shaped holder on which a substrate is placed and which is provided in the reaction chamber and includes a ring-shaped outer portion and a ring-shaped inner portion having a substrate mounting surface that is lower than an upper surface of the outer portion and is a curved surface having six-fold rotational symmetry in which convex regions and concave regions are repeated in a circumferential direction; and a heater provided below the ring-shaped holder.

A ring-shaped holder according to this embodiment includes: a ring-shaped outer portion; and a ring-shaped inner portion having a substrate mounting surface that is lower than an upper surface of the outer portion. The substrate mounting surface is a curved surface having six-fold rotational symmetry in which convex regions and concave regions are repeated in a circumferential direction.

A vapor phase growth method according to this embodiment includes: placing a silicon substrate having a {111} face as a surface on a ring-shaped holder, which includes a ring-shaped outer portion and a ring-shaped inner portion having a substrate mounting surface that is lower than an upper surface of the outer portion and is a curved surface having six-fold rotational symmetry in which convex regions and concave regions are repeated in a circumferential direction, such that a <1-10> direction of the silicon substrate is aligned with a direction connecting the convex regions facing each other or a direction connecting the concave regions facing each other; heating the silicon substrate using a heater provided below the ring-shaped holder; and forming a film on the silicon substrate.

Figure 1:
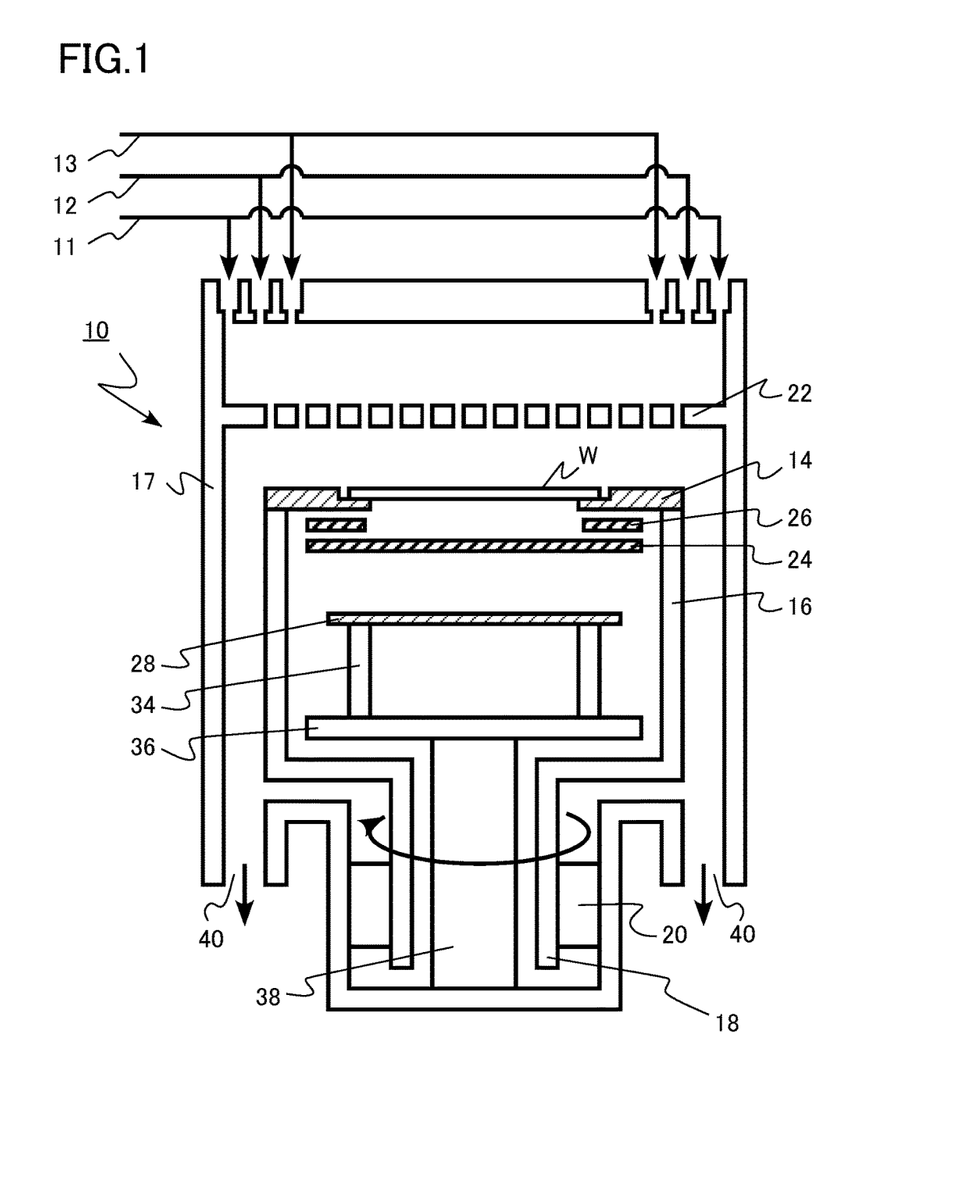
FIG. 1 is a cross-sectional view schematically illustrating a vapor phase growth apparatus according to a first embodiment.

FIG. 1 is a cross-sectional view schematically illustrating the vapor phase growth apparatus according to this embodiment. The vapor phase growth apparatus according to this embodiment is, for example, a single wafer type epitaxial growth apparatus that uses a metal organic chemical vapor deposition method (MOCVD method).

The vapor phase growth apparatus according to this embodiment includes a reaction chamber 10, a first gas supply path 11, a second gas supply path 12, and a third gas supply path 13. The reaction chamber 10 includes a ring-shaped holder 14, a rotating unit 16, a rotating shaft 18, a rotating mechanism 20, a shower plate 22, an in-heater (heater) 24, an out-heater 26, a reflector 28, a support column 34, a fixed table 36, a fixed shaft 38, and a gas outlet 40.

The first gas supply path 11, the second gas supply path 12, and the third gas supply path 13 supply process gas to the reaction chamber 10.

The first gas supply path 11 supplies, for example, a first process gas including organic metal, which is a group-III element, and carrier gas to the reaction chamber 10. The first process gas is gas including a group-III element when a group III-V semiconductor film is formed on a wafer.

The group-III element is, for example, gallium (Ga), aluminum (Al), or indium (In). In addition, the organic metal is, for example, trimethylgallium (TMG), trimethylaluminum (TMA), or trimethylindium (TMI).

The second gas supply path 12 supplies, for example, a second process gas including ammonia ($NH_3$) to the reaction chamber 10. The second process gas is a source gas of a group-V element and nitrogen (N) when a group III-V semiconductor film is formed on a wafer.

The third gas supply path 13 supplies, for example, a diluent gas which dilutes the first process gas and the second process gas to the reaction chamber 10. The first process gas and the second process gas are diluted with the diluent gas to adjust the concentration of the group-III element and the group-V element supplied to the reaction chamber 10. The diluent gas is inert gas, such as hydrogen gas, nitrogen gas, or argon gas, or a mixed gas thereof.

The reaction chamber 10 includes, for example, a stainless cylindrical wall surface 17. The shower plate 22 is provided in an upper part of the reaction chamber 10. A plurality of gas ejection holes are provided in the shower plate 22. The process gas is supplied from the plurality of gas ejection holes to the reaction chamber 10.

The ring-shaped holder 14 is provided in the reaction chamber 10. A wafer W which is an example of a substrate can be placed on the ring-shaped holder 14. The ring-shaped holder 14 is configured to hold the wafer W. An opening portion is provided at the center of the ring-shaped holder 14.

The ring-shaped holder 14 is made of ceramics, such as silicon carbide (SiC) tantalum carbide (TaC), boron nitride (BN), and pyrolytic graphite (PG), or carbon as a base material. Carbon coated with, for example, SiC, BN, TaC, or PG can be used as the ring-shaped holder 14.

The ring-shaped holder 14 is fixed to an upper part of the rotating unit 16. The rotating unit 16 is fixed to the rotating shaft 18. The ring-shaped holder 14 is indirectly fixed to the rotating shaft 18.

The rotating shaft 18 can be rotated by the rotating mechanism 20. The rotating mechanism 20 can rotate the rotating shaft to rotate the ring-shaped holder 14. The ring-shaped holder 14 is rotated to rotate the wafer W placed on the ring-shaped holder 14.

For example, the wafer W is rotated at a speed that is equal to or greater than 50 rpm and equal to or less than 3000 rpm. The rotating mechanism 20 includes, for example, a motor and a bearing.

The in-heater 24 and the out-heater 26 are provided below the ring-shaped holder 14. The in-heater 24 and the out-heater 26 are provided in the rotating unit 16. The out-heater 26 is provided between the in-heater 24 and the ring-shaped holder 14.

The in-heater 24 and the out-heater 26 heat the wafer W held by the ring-shaped holder 14. The in-heater 24 heats at least a central portion of the wafer W. The out-heater 26 heats an outer circumferential region of the wafer W. The in-heater 24 has, for example, a disk shape. The out-heater 26 has, for example, a ring shape.

The reflector 28 is provided below the in-heater 24 and the out-heater 26. The in-heater 24 and the out-heater 26 are provided between the reflector 28 and the ring-shaped holder 14.

The reflector 28 reflects heat that is radiated downward from the in-heater 24 and the out-heater 26 to improve the heating efficiency of the wafer W. In addition, the reflector 28 prevents members below the reflector 28 from being heated. The reflector 28 has, for example, a disk shape.

The reflector 28 is made of a material with high heat resistance. The reflector 28 has, for example, resistance to a heat temperature of 1100° C. or more.

The reflector 28 is made of ceramics, such as SiC, TaC, carbon, BN, and PG, or metal, such as tungsten, as a base material. When the reflector 28 is made of ceramics, a sintered body or a base material produced by vapor phase growth can be used. In addition, the reflector 28 may be made of a material obtained by coating a carbon base material with ceramics, such as SiC, TaC, BN, PG, and glassy carbon.

The reflector 28 is fixed to the fixed table 36 by, for example, a plurality of support columns 34. The fixed table 36 is supported by, for example, the fixed shaft 38.

The rotating unit 16 is provided with, for example, a push up pin (not illustrated) in order to attach or detach the wafer W to or from the ring-shaped holder 14. The push up pin passes through, for example, the reflector 28 and the in-heater 24.

The gas outlet 40 is provided at the bottom of the reaction chamber 10. The gas outlet 40 discharges a surplus reaction product after the source gas reacts on the surface of the wafer W and a surplus process gas to the outside of the reaction chamber 10.

A wafer inlet and a gate valve (not illustrated) are provided in the wall surface 17 of the reaction chamber 10. The wafer W can be loaded to the reaction chamber 10 or can be unloaded from the reaction chamber 10 by the wafer inlet and the gate valve.

Figure 2:
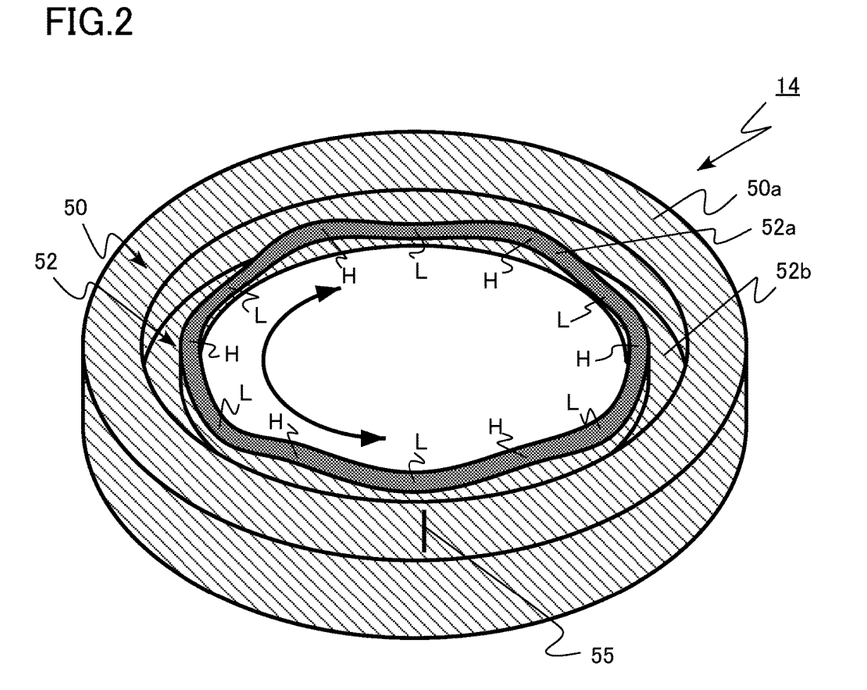
FIG. 2 is a diagram schematically illustrating a ring-shaped holder according to the first embodiment.
Figure 3A:
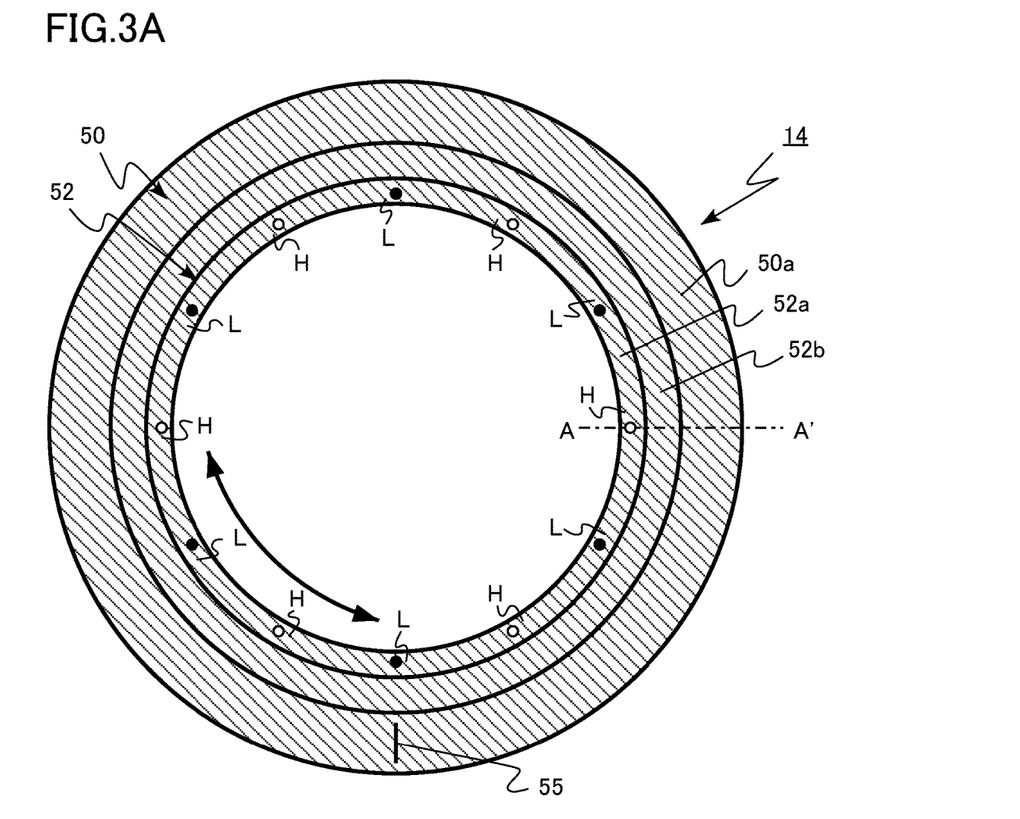
FIGS. 3A and 3B are diagrams schematically illustrating the ring-shaped holder according to the first embodiment.
Figure 3B:
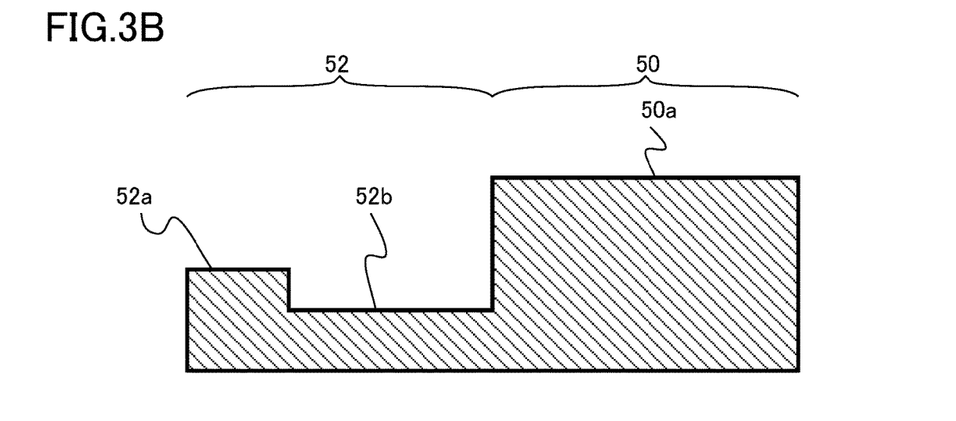

FIG. 2 and FIGS. 3A and 3B are diagrams schematically illustrating the ring-shaped holder according to this embodiment. FIG. 2 is a perspective view. FIG. 3A is a top view and FIG. 3B is a cross-sectional view taken along the line AA' of FIG. 3A.

The ring-shaped holder 14 includes an outer portion 50 and an inner portion 52. The outer portion 50 has ring-shape. The inner portion 52 has ring-shape. The inner portion 52 is provided inside the outer portion 50. For example, the outer portion 50 and the inner portion 52 are integrally molded.

The inner portion 52 is a counterbore of the ring-shaped holder 14. The wafer W which is an example of the substrate is held on the inner portion 52 and inside the outer portion 50.

The inner portion 52 has a substrate mounting surface 52a and a groove 52h. The substrate mounting surface 52a has a ring shape. The substrate mounting surface 52a is lower than an upper surface 50a of the outer portion 50. The substrate mounting surface 52a is positioned below the upper surface 50a of the outer portion 50. The wafer W is placed on the substrate mounting surface 52a.

The substrate mounting surface 52a is a curved surface which has six-fold rotational symmetry and in which convex regions H and concave regions L are repeated in a circumferential direction. The convex regions H and the concave regions L are repeated with a period of 60 degrees in the circumferential direction. That is, when the substrate mounting surface 52a is rotated by 60 degrees in the circumferential direction, the shape of the substrate mounting surface 52a is the same as the shape of the substrate mounting surface 52a before the rotation. The circumferential direction is a direction represented by a double-headed arrow in FIG. 2 and FIG. 3A.

In FIG. 3A, a white circle on the substrate mounting surface 52a indicates the highest portion of the convex region H and a black circle indicates the lowest portion of the concave region L. The difference in height between the highest portion and the lowest portion of the substrate mounting surface 52a is, for example, equal to or greater than 10 µm and equal to or less than 100 µm.

The substrate mounting surface 52a has, for example, a sine-wave shape.

In the specification, the "curved surface" includes a continuation of surfaces with a minute step shape. For example, when a difference in level between the step-shaped surfaces is equal to or less than one tenth of the difference in level between the highest portion and the lowest portion of the substrate mounting surface 52a, a continuation of the step-shaped surfaces is regarded as the curved surface.

The groove 52b is provided between the substrate mounting surface 52a and the outer portion 50. The groove 52b has a ring shape.

For example, an alignment mark 55 is provided on the upper surface 50a of the outer portion 50 at a position corresponding to one of the lowest portions of the substrate mounting surface 52a. The alignment mark 55 is, for example, a linear groove provided in the upper surface 50a. In addition, the alignment mark may have a shape that protrudes toward the inner portion 52 from a sidewall of the outer portion 50. In general, a cutout, such as a notch or an orientation flat, is provided in the wafer W in order to indicate crystal orientation. The shape of the alignment mark protruding toward the inner portion 52 from a sidewall of the outer portion 50 may be matched with the shape of the cutout.

The alignment mark 55 is used as a positioning mark, for example, when the ring-shaped holder 14 is attached to the rotating unit 16. For example, the alignment mark 55 is used as a positioning mark when the wafer W is placed on the ring-shaped holder 14. It is difficult to visually recognize the unevenness of the substrate mounting surface 52a. Therefore, it is useful to provide the alignment mark 55.

The alignment marks 55 may be provided at a plurality of positions. In addition, the alignment marks 55 may be provided at positions corresponding to the highest portions of the substrate mounting surface 52a. The alignment marks 55 may be provided at positions corresponding to both the highest portions and the lowest portions of the substrate mounting surface 52a. The alignment marks 55 may be provided at positions other than the upper surface 50a of the outer portion 50.

Figure 4:
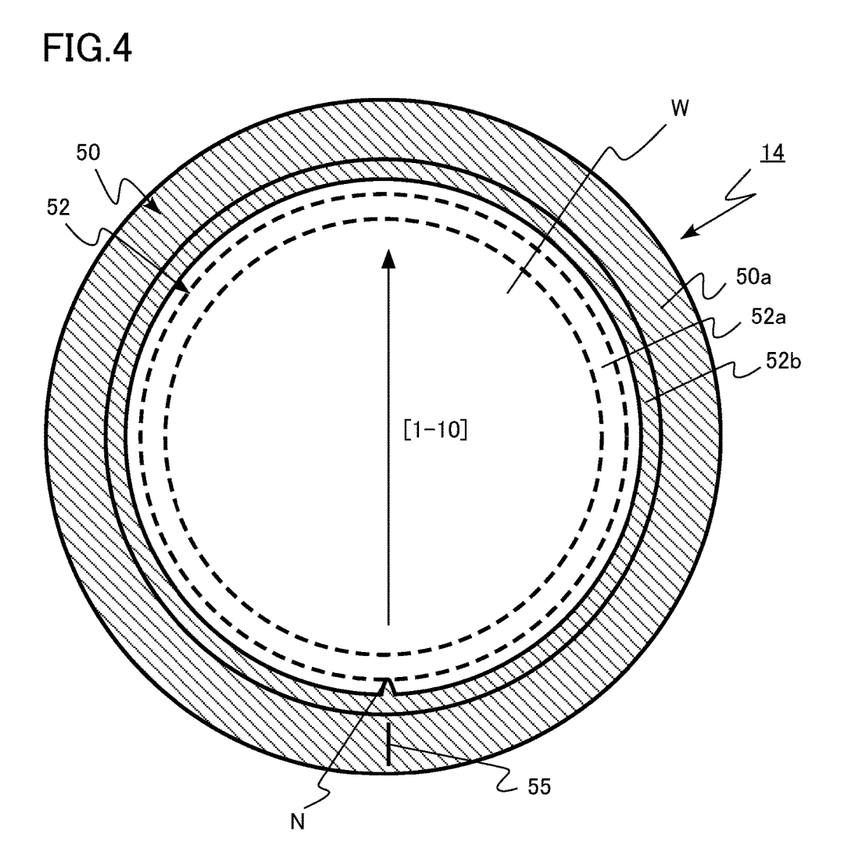
FIG. 4 as a diagram illustrating a vapor phase growth method according to the first embodiment.

Next, a vapor phase growth method according to this embodiment will be described. The vapor phase growth method according to this embodiment uses the epitaxial growth apparatus illustrated in FIG. 1. FIG. 4 is a diagram illustrating the vapor phase growth method according to this embodiment.

An example in which a stacked film is formed on a GaN based film will be described. The stacked film is formed by alternately stacking a plurality of indium gallium nitride (InGaN) films and a plurality of gallium nitride (GaN) films. The GaN film and the InGaN film are an example of a nitride semiconductor film. The stacked film is, for example, a multi-quantum well (MQW) layer used in a light emitting layer of a light emitting diode (LED).

First, the wafer N is loaded to the reaction chamber 10. The wafer N is a silicon substrate of which the surface is a {111} face. An error in the crystal orientation of the wafer W is preferably equal to or less than 3 degrees and more preferably equal to or less than 2 degrees. In the example illustrated in FIG. 4, the diametrical direction of the silicon substrate including a notch N is a [1-10] direction. The thickness of the silicon substrate is, for example, equal to or greater than 700 µm and equal to or less than 1.2 mm. The {111} face indicates a face that is crystallographically equivalent to a (111) face. FIG. 4 illustrates an example in which a notch is provided in order to indicate the direction of the crystal axis of the substrate. However, in some cases, for example, an orientation flat may be provided in order to indicate the direction of the crystal axis of the substrate.

Then, the wafer W is placed on the substrate mounting surface 52a of the ring-shaped holder 14. As illustrated in FIG. 4, the wafer H is placed such that the <1-10> direction of the silicon substrate is aligned with a direction connecting the concave regions L which face each other. Specifically, the wafer H is placed such that the <1-10> direction of the silicon substrate is aligned with a direction connecting the lowest portions of the concave regions L which face each other in the diametrical direction, with the center of the ring-shaped holder 14 interposed therebetween.

For example, the wafer W is placed such that the notch N of the wafer W is aligned with the alignment mark 55 to align the [1-10] direction of the silicon substrate with the direction connecting the concave regions L which face each other. The <1-10> direction indicates a direction that is crystallographically equivalent to the [1-10] direction.

When the notch N of the wafer H is aligned with the alignment mark 55, all of three directions which are the directions connecting the concave regions L facing each other are aligned with the [1-10] direction of the silicon substrate. The [1-10] direction of the silicon substrate is not necessarily exactly aligned with the direction connecting the concave regions L that face each other. The directions may be substantially aligned with each other in the range of an error that may occur when the wafer W is placed on the ring-shaped holder 14. For example, the directions may be aligned with in an angular range of ±3 degrees.

Then, the wafer W is heated by the in-heater 24 and the out-heater 26 provided below the ring-shaped holder 14 while being rotated by the rotating mechanism 20.

Then, aluminum nitride (AlN) and aluminum gallium nitride (AlGaN) buffer layers are formed on the wafer, using TMA, TMG, and ammonia, and a GaN based film is grown. Then, an InGaN film and a GaN film are alternately formed on the GaN based film to form an MQW layer.

When the InGaN film is formed, for example, a mixed gas of TMG and TMI having nitrogen gas as carrier gas is supplied from the first gas supply path 11 to the reaction chamber 10. In addition, for example, ammonia is supplied from the second gas supply path 12 to the reaction chamber 10. For example, nitrogen gas is supplied as diluent gas from the third gas supply path 13 to the reaction chamber 10.

When a GaN film is formed, for example, TMG having nitrogen gas as carrier gas is supplied from the first gas supply path 11 to the reaction chamber 10. In addition, for example, ammonia is supplied from the second gas supply path 12 to the reaction chamber 10. For example, nitrogen gas is supplied as diluent gas from the third gas supply path 13 to the reaction chamber 10.

After the MQW layer is formed, the heating of the wafer W by the in-heater 24 and the out-heater 26 is stopped and the temperature of the wafer W is reduced. Then, the wafer is unloaded from the reaction chamber 10.

Next, the function and effect of the vapor phase growth apparatus, the ring-shaped holder, and the vapor phase growth method according to this embodiment will be described.

The characteristics of an epitaxial single-crystal film formed on the surface of the wafer W, for example, the thickness, chemical composition, and crystallinity of the film depend on the temperature of the wafer W at the time when the film is grown (growth temperature). Therefore, when there is a large variation in the growth temperature within the surface of the wafer W, the characteristics of the film vary within the surface of the wafer W. For this reason, it is preferable to improve the uniformity of the growth temperature within the surface of the wafer.

FIG. 5, FIGS. 6A and 6B, and FIG. 7 are diagrams illustrating the function and effect of the vapor phase growth apparatus according to this embodiment.

Figure 5:
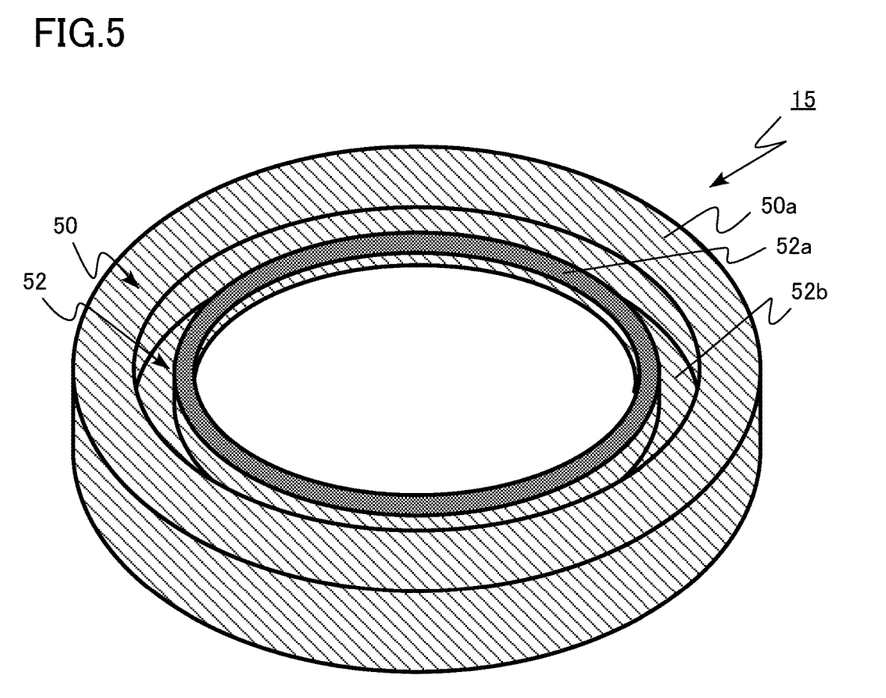
FIG. 5 is a diagram illustrating the function and effect of the vapor phase growth apparatus according to the first embodiment.

FIG. 5 is a perspective view illustrating a ring-shaped holder 15 according to a comparative example. The ring-shaped holder 15 according to the comparative example differs from the ring-shaped holder 14 according to this embodiment in that a substrate mounting surface 52a is not a curved surface, but is a flat surface. The ring-shaped holder 15 according to the comparative example differs from the ring-shaped holder 14 according to this embodiment in that the convex region H and the concave region L are not provided in the substrate mounting surface 52a in the circumferential direction.

Figure 6A:
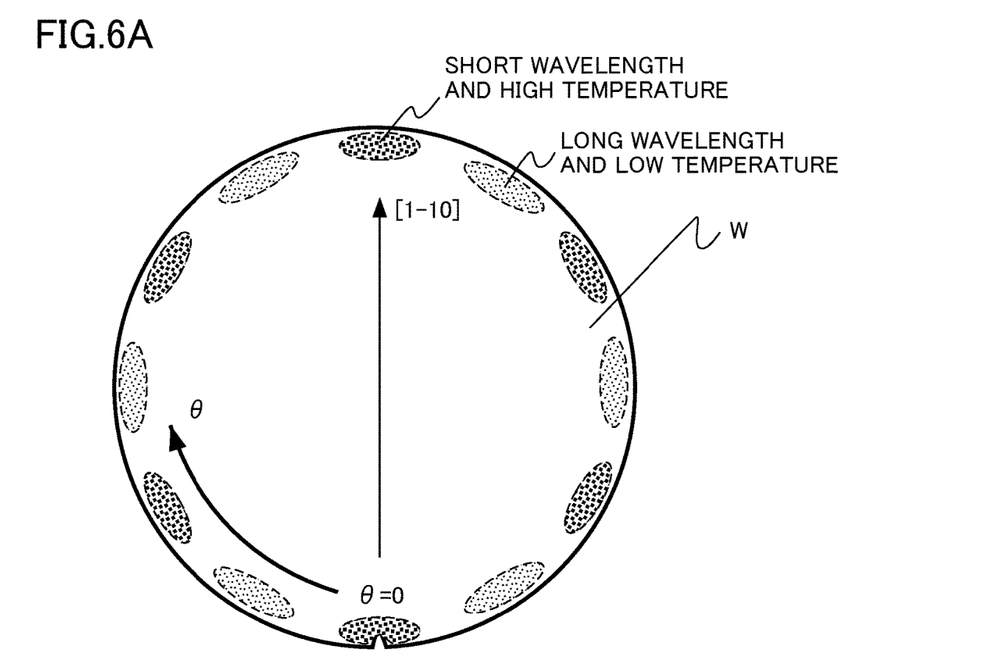
FIGS. 6A and 6B are diagrams illustrating the function and effect of the vapor phase growth apparatus according to the first embodiment.
Figure 6B:
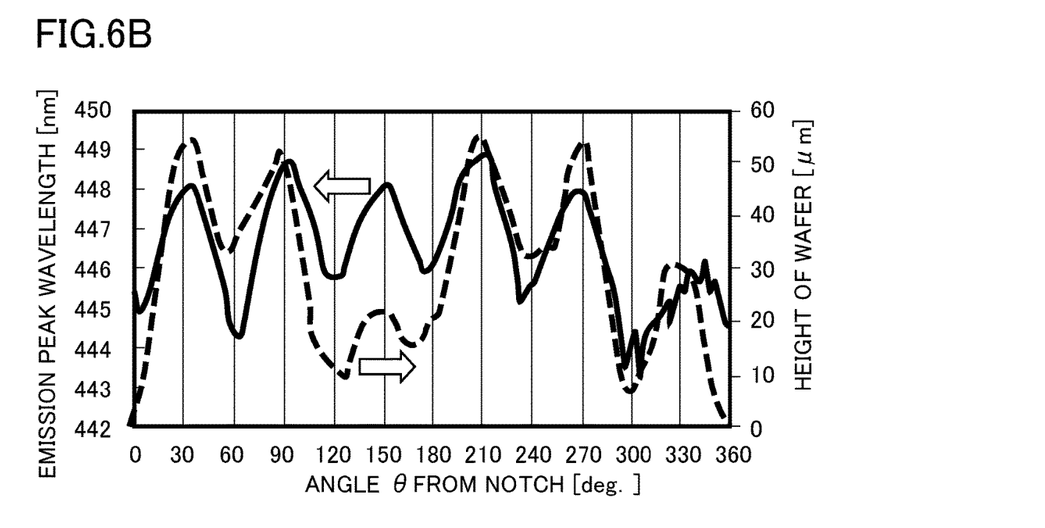

FIGS. 6A and 6B are diagrams illustrating the results when an MQW layer is formed by the same method as the above-mentioned vapor phase growth method, using the ring-shaped holder 15 according to the comparative example. FIG. 6A is a diagram illustrating the characteristic distribution of the surface of the wafer W and FIG. 6B is a graph illustrating the characteristic distribution of an outer circumferential region of the wafer W in the circumferential direction.

In FIG. 6B, the horizontal axis indicates a position in the circumferential direction and the vertical axis indicates the emission peak wavelength of the MQW layer and the height of the wafer. A solid line indicates the emission peak wavelength and a dotted line indicates the height of the wafer. The circumferential direction means a direction indicated by an arrow in FIG. 6A. The height of the wafer means the height of the surface of the wafer measured after a layer including an MQW is formed on the wafer W and is based on the lowest position of the surface of the wafer.

The emission peak wavelength is obtained by excitation light to the wafer W and measuring the wavelength of fluorescent light emitted from the MQW layer. FIG. 6B illustrates the dependence of the emission peak wavelength in the outer circumferential region of the wafer W in the circumferential direction.

The emission peak wavelength of the MQW layer depends on the temperature of the wafer W during the formation of the MQW layer. For example, as the temperature of the wafer W during the formation of the MQW layer increases, the emission peak wavelength is reduced. In addition, for example, as the temperature of the wafer W during the formation of the MQW layer is reduced, the emission peak wavelength increases.

FIG. 6B illustrates an example of the measurement results of the distribution of the emission peak wavelength in the outer portion of the wafer W and the distribution of the height of the wafer. A layer including an MQW has been actually grown on the wafer W. As illustrated in FIG. 6B, the emission peak wavelength in the outer portion of the wafer W periodically changes and the change is identical to a change in the height. of the wafer W. In addition, as illustrated in FIG. 6B, each region appears with a period of 60 degrees. In other words, the distribution of the emission peak wavelength in the outer circumferential region of the wafer W has six-fold rotational symmetry.

When this result, and the relationship between the temperature of the wafer during the growth of the MQW layer and the emission peak wavelength are considered, a region with a short emission peak wavelength, that is, a region with a high temperature during the formation of the MQW layer (a region with a short wavelength and a high temperature in FIG. 6A) and a region with a long emission peak wavelength, that is, a region with a low temperature during the formation of the MQW layer (a region with a long wavelength and a low temperature in FIG. 6A) are alternately present in the outer circumferential region of the wafer W in the circumferential direction during the formation of the MQW layer, as illustrated in FIG. 6A.

As illustrated in FIG. 6B, the height of the wafer W in the region with a high temperature during deposition is small and the height of the wafer W in the region with a low temperature during deposition is large. The region with a high temperature during deposition is a region corresponding to the <1-10> direction of the silicon substrate in the outer portion of the wafer W as viewed from the center of the wafer.

Even when the wafer W is rotated by 30 degrees in advance and then the ring-shaped holder 15 is placed, the region with a high temperature during deposition is aligned with the <1-10> direction of the silicon substrate of the wafer W. Therefore, the temperature distribution of the ring-shaped holder 15 itself is not a cause of a periodic temperature distribution.

From the above-mentioned results, it is considered that the temperature distribution of the outer circumferential region of the wafer W occurs for the following reason. That is, during the formation of the MQW layer, the wafer W is deformed depending on crystal orientation and warpage occurs periodically in the circumferential direction in the outer circumferential region of the wafer W. When the wafer W warps, a region with a small height in the rear surface of the wafer W comes into contact with the substrate mounting surface 52a of the ring-shaped holder 15. In contrast, a region with a large height in the rear surface of the wafer W is separated from the substrate mounting surface 52a of the ring-shaped holder 15 and does not come into contact with the substrate mounting surface 52a of the ring-shaped holder 15.

During deposition, the wafer W is heated by the in-heater 24 and the out-heater 26 from the rear surface side. Thermal conduction occurs between the rear surface of the wafer W and the ring-shaped holder 15 through the substrate mounting surface 52a.

Therefore, for example, in the rear surface of the wafer W, a region which comes into contact with the substrate mounting surface 52a has a high temperature and a region that does not come into contact with the substrate mounting surface 52a has a low temperature. In the example according to this embodiment, a region of the wafer W in the <1-10> direction of the silicon substrate has a small height, comes into contact with the substrate mounting surface 52a, and has a high temperature. In contrast, a region of the wafer W which deviates from the <1-10> direction by an angle of 30 degrees has a large height, does not come into contact with the substrate mounting surface 52a, and has a low temperature.

As illustrated in FIG. 2 and FIG. 3A, the ring-shaped holder 14 according to this embodiment has the substrate mounting surface 52a in which the convex regions H and the concave regions L are repeated with a period of 60 degrees in the circumferential direction. The <1-10> direction of the silicon substrate is aligned with the concave region L to match the uneven shape of the rear surface of the wafer W caused by the warpage of the wafer W with the unevenness of the substrate mounting surface 52a. Therefore, the rear surface of the wafer W comes into close contact with the substrate mounting surface 52a and the occurrence of a periodic temperature distribution depending on crystal orientation in the outer circumferential region of the wafer W is prevented.

It may be difficult to completely match the shape of the curved surface of the substrate mounting surface 52a with the shape of the rear surface of the wafer W. However, even when a portion of the rear surface of the wafer W does not come into contact with the substrate mounting surface 52a, the distance between the substrate mounting surface 52a and the rear surface of the wafer W is significantly less than that in the comparative example. The temperature of the wafer W is also increased by heat radiated from the substrate mounting surface 52a. Therefore, even when a portion of the rear surface of the wafer W does not come into contact with the substrate mounting surface 52a, the occurrence of a periodic temperature distribution depending on crystal orientation in the outer circumferential region of the wafer W is prevented since the distance between the substrate mounting surface 52a and the rear surface of the wafer W is short.

In the ring-shaped holder 14 according to this embodiment, the difference in height between the highest portion and the lowest portion of the substrate mounting surface 52a is preferably equal to or greater than 10 μm and equal to or less than 100 μm and more preferably equal to or greater than 20 μm and equal to or less than 50 μm. When the difference is less than the above-mentioned range, there is a concern that it will be difficult to sufficiently respond to the warpage of the wafer W. When the difference is greater than the above-mentioned range and the wafer W warps, there is a concern that slip will occur in the wafer W.

Figure 7:
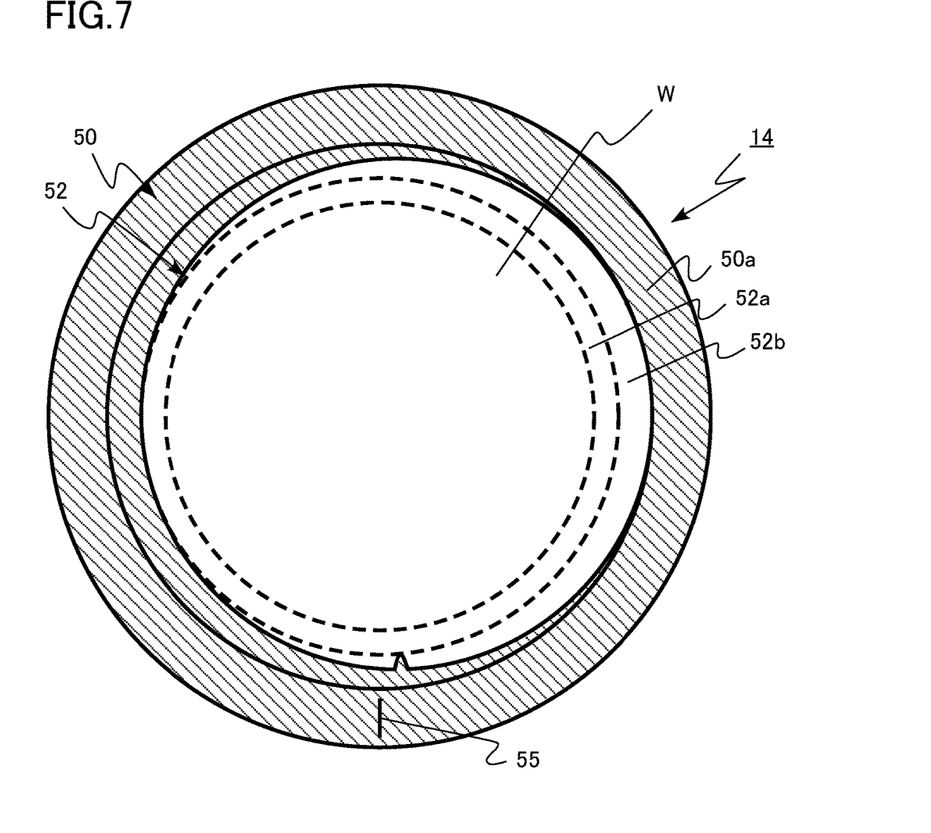
FIG. 7 is a diagram illustrating the function and effect of the vapor phase growth apparatus according to the first embodiment.

FIG. 7 is a top view illustrating a state in which the wafer W is placed such that the center of the wafer 8 deviates from the center of the ring-shaped holder 14. For example, while a film is formed on the wafer W, the ring-shaped holder 14 having the wafer W placed thereon is rotated. At that time, in some cases, the center of the wafer W deviates from the center of the ring-shaped holder 14 due to centrifugal force applied to the wafer W.

For example, in a case in which the groove 52b is not provided in the ring-shaped holder, when the center of the wafer W deviates from the center of the ring-shaped holder 14, the contact area of the outer circumference of the rear surface of the wafer W with the ring-shaped holder varies depending on the position. Therefore, the temperature of the outer circumferential region of the wafer W is likely to vary.

In the ring-shaped holder 14 according to this embodiment, the groove 52b is provided between the substrate mounting surface 52a and the outer portion 50. Therefore, the rear surface of the wafer W comes into contact with only the substrate mounting surface 52a of the inner portion 52 in the ring-shaped holder 14.

Therefore, even when the center of the wafer W deviates from the center of the ring-shaped holder 14 as illustrated in FIG. 7, the contact area between the outer circumference of the rear surface of the wafer W and the ring-shaped holder 14 does not vary depending on the position. As a result, the temperature of the outer circumferential region of the wafer W is less likely to vary than that in, for example, the ring-shaped holder without the groove 52b.

As described above, according to the vapor phase growth apparatus, the ring-shaped holder, and the vapor phase growth method according to this embodiment, since a variation in the temperature of the outer circumferential region of the wafer W the circumferential direction is reduced, it is possible to improve the uniformity of the temperature of the wafer. Therefore, it is possible to form a film with a small variation in characteristics.

Second Embodiment

A vapor phase growth apparatus and a ring-shaped holder according to this embodiment are the same as the vapor phase growth apparatus and the ring-shaped holder according to the first embodiment except that a plurality of island-shaped protrusions which protruded from an inner sidewall of the outer portion are provided in the inner portion.

Therefore, the description of the same content as that in the first embodiment may not be repeated.

Figure 8A:
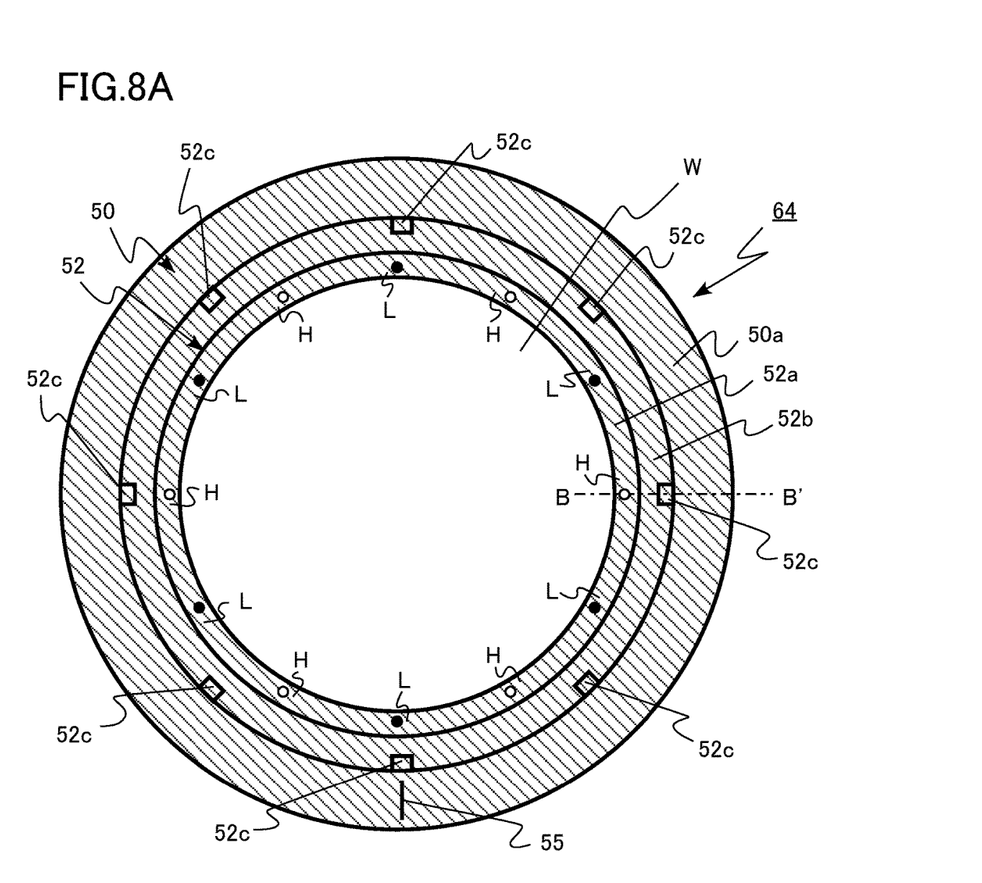
FIGS. 8A and 8B are diagrams schematically illustrating a ring-shaped holder according to a second embodiment.
Figure 8B:
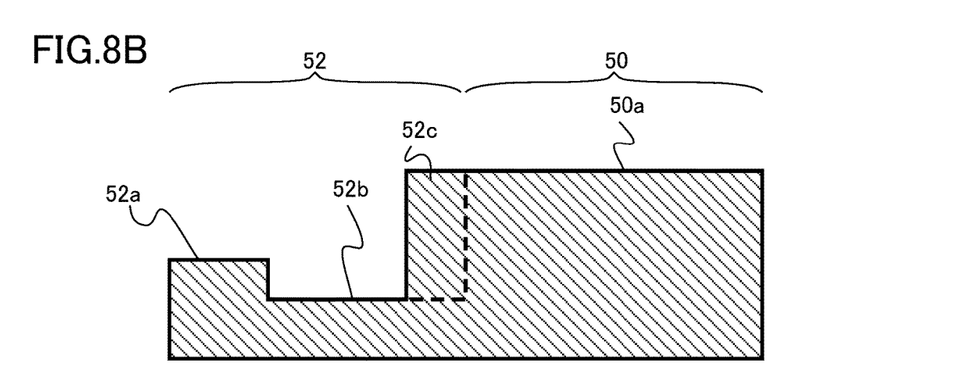

FIGS. 8A and 8B are diagrams illustrating the ring-shaped holder according to this embodiment. FIG. 8A is a top view and FIG. 8B is a cross-sectional view taken along the line BB' of FIG. 8A.

A ring-shaped holder 64 according to this embodiment includes a plurality of island-shaped protrusions 52c that are provided in the inner portion 52 so as to protruded from an inner sidewall of the outer portion 50. For example, the island-shaped protrusions 52c are provided at eight positions of an inner sidewall of the outer portion 50 so as to protrude to the center. The plurality of island-shaped protrusions 52c are separated from the substrate mounting surface 52a.

Figure 9:
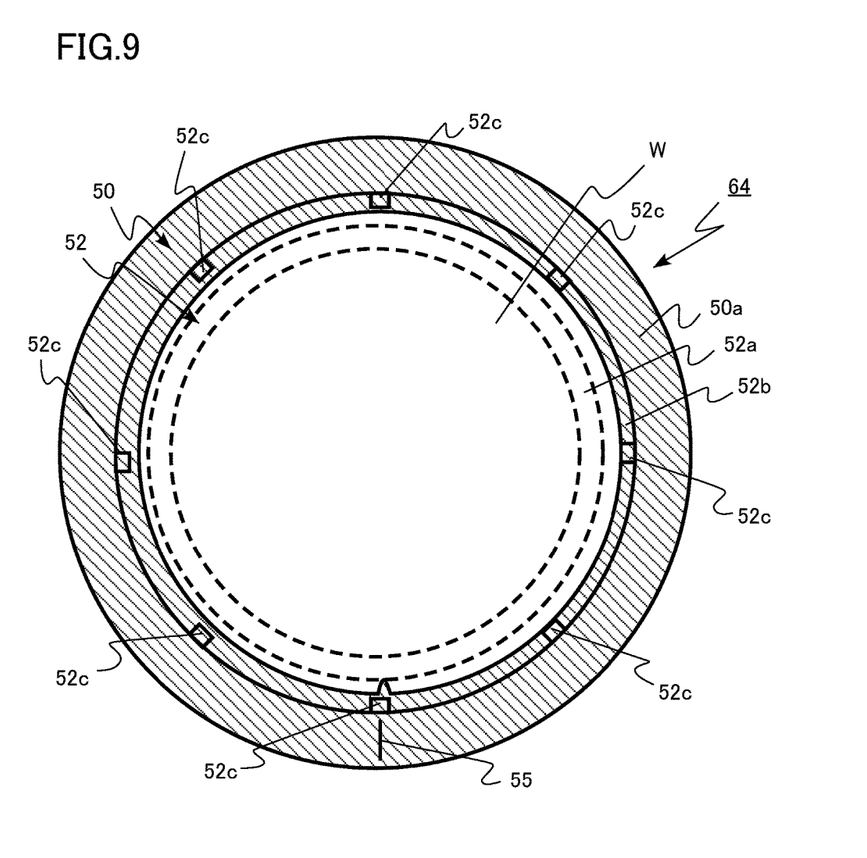
FIG. 9 is a diagram illustrating the function and effect of a vapor phase growth apparatus according to the second embodiment.

FIG. 9 is a diagram illustrating the function and effect of the vapor phase growth apparatus according to this embodiment. FIG. 9 is a top view illustrating a state in which the wafer W is placed such that the center of the wafer W deviates from the center of the ring-shaped holder 64.

The unevenness of the substrate mounting surface 52a is formed on the premise that the center of the wafer W is aligned with the center of the ring-shaped holder 64. Therefore, when the wafer W is placed such that the center of the wafer W deviates from the center of the ring-shaped holder 64, the uneven shape of the rear surface of the wafer 51 caused by the warpage of the wafer W may not match with the uneven shape of the substrate mounting surface 52a and there is a concern that a variation in the temperature of the outer circumferential region of the wafer W in the circumferential direction will increase.

For example, as illustrated in FIG. 7, in the case of the ring-shaped holder 14 according to the first embodiment, there is a large amount of deviation between the center of the wafer W and the center of the ring-shaped holder 14. In addition, the end of the wafer W and the outer portion 50 come into contact with each other or are close to each other in a wide range. As a result, for example, the temperature of the end of the wafer is increased by thermal conduction from the outer portion 50. Therefore, there is a concern that a variation in the temperature of the outer circumferential region of the wafer W in the circumferential direction will further increase.

In the case of the ring-shaped holder 64 according to this embodiment, the plurality of island-shaped protrusions 52c are provided in the inner portion 52 so as to protrude toward the inside of the outer portion 50. Therefore, even when the center of the wafer W deviates from the center of the ring-shaped holder 64 as illustrated in FIG. 9, the end of the wafer W comes into contact with the island-shaped protrusions 52c and it is possible to reduce the amount of deviation between the center of the wafer W and the center of the ring-shaped holder 64. As a result, it is possible to reduce the mismatch between the uneven shape of the rear surface of the wafer W caused by the warpage of tie wafer W and the uneven shape of the substrate mounting surface 52a.

The end of the wafer W comes into contact with the outer portion 50 through only the island-shaped protrusions 52c. Therefore, the contact area between the end of the wafer W and the outer portion 50 is less than that in the first embodiment illustrated in FIG. 7. As a result, a variation in the temperature of the outer circumferential region of the wafer W in the circumferential direction is reduced.

The number of island-shaped protrusions 52c is not necessarily limited to 8. The number of island-shaped protrusions 52c may be less than 8 or may be greater than 8. However, when the center of the wafer W deviates from the center of the ring-shaped holder 64, it is preferable that the end of the wafer W certainly come into contact with the protrusions 52c. From this point of view, it is preferable that the number of island-shaped protrusions 52c be at least equal to or greater than 3.

According to the vapor phase growth apparatus of this embodiment, a variation in the temperature of the outer circumferential region of the wafer W in the circumferential direction can be made less than that in the first embodiment. Therefore, it is possible to further improve the uniformity of the temperature of the wafer.

The embodiments of the invention have been described above with reference to examples. The above-described embodiments are illustrative examples and do not limit the invention. In addition, the components according to each embodiment may be appropriately combined with each other.

For example, in the embodiments, an example in which the ring-shaped groove 52b is provided in the inner portion 52 has been described. However, the ring-shaped groove 52b may not be provided.

In the embodiments, the single wafer type vapor phase growth apparatus has been described as an example. However, the vapor phase growth apparatus is not limited to the single wafer type as long as it uses the ring-shaped holder. The invention can also be applied to a batch-type vapor phase growth apparatus that forms films on a plurality of wafers W at the same time.

In the embodiments, an example in which a stacked film obtained by stacking a plurality of indium gallium nitride films and a plurality of gallium nitride films on a GaN film is epitaxiall y grown has been described. However, for example, the invention can be applied to form other group III-V nitride-based semiconductor single-crystal films, such as an aluminum nitride (AlN) film and an aluminum gallium nitride (AlGaN) film. Furthermore, the invention can be applied to a group III-V semiconductor such as GaAs. In addition, the invention can be applied to form other films.

In the embodiments, a case in which the process gas is mixed in the shower plate has been described as an example. However, the process gas may be mixed before it flows into the shower plate. In addition, the process gas may be in a separated state until it is ejected from the shower plate into the reaction chamber.

An example in which the outer portion 50 and the inner portion 52 of the ring-shaped holders 14 and 64 are integrally molded has been described. However, the ring-shaped holders 14 and 64 may have a structure in which the inner portion 52 or a portion of the inner portion 52 can be separated. When the inner portion 52 or a portion of the inner portion 52 can be separated, for example, the ring-shaped holder with various shapes can be applied and it is easy to finely adjust the temperature distribution of the outer circumferential region of the wafer W. Furthermore, the ring-shaped holders 14 and 64 are used in combination with disk-shaped holders (suseptor) or the ring-shaped holders 14 and 64 may be integrally molded with the disk-shaped holders (suseptor).

In the embodiments, an example in which two types of heaters, that is, the in-heater 24 and the out-heater 26 are provided has been described. However, only one type of heater may be provided. And, equal to or more than three types of heaters may be provided There is a case in which films are formed on the wafer W according to the above-described embodiments, the characteristics in the circumferential direction are evaluated, and the difference in level between convex regions and concave regions is more finely adjusted to further improve the uniformity of the characteristics in the circumferential direction. In such a case, it is preferable to perform the fine adjustment.

In the embodiments, for example, portions which are not directly necessary, to describe the invention, such as the structure of the apparatus or a manufacturing method, are not described. However, the necessary structure of the apparatus or a necessary manufacturing method can be appropriately selected and used. In addition, all of the vapor phase growth apparatuses, the ring-shaped holders, and the vapor phase growth methods which include the components according to the invention and whose design can be appropriately changed by those skilled in the art are included in the scope of the invention. The scope of the invention is defined by the scope of the claims and the scope of equivalents thereof.

What is claimed is:

1. A vapor phase growth apparatus comprising:
   a reaction chamber;
   a ring-shaped holder provided in the reaction chamber, the ring-shaped holder configured to hold a substrate, the ring-shaped holder including an outer portion having ring-shape and an inner portion having ring-shape, the inner portion including a substrate mounting surface positioned below an upper surface of the outer portion, the substrate mounting surface being a curved surface, the curved surface having convex regions and concave regions repeated in a circumferential direction, the curved surface having six-fold rotational symmetry; and
   a heater provided below the ring-shaped holder.

2. The vapor phase growth apparatus according to claim 1,
   wherein the inner portion has a ring-shaped groove provided between the substrate mounting surface and the outer portion.

3. The vapor phase growth apparatus according to claim 1,
   wherein the inner portion has a plurality of protrusions protruding from an inner sidewall of the outer portion.

4. The vapor phase growth apparatus according to claim 1,
   wherein a difference in height between a highest portion of the convex region and a lowest portion of the concave region is equal to or greater than 10 µm and equal to or less than 100 µm.

5. The vapor phase growth apparatus according to claim 1,
   wherein the substrate mounting surface has a sine-wave shape.

6. The vapor phase growth apparatus according to claim 1,
   wherein the ring-shaped holder has an alignment mark provided on the upper surface of the outer portion at a position corresponding to a lowest portion of the concave region.

7. The vapor phase growth apparatus according to claim 1, further comprising:
   a rotating shaft fixed to the ring-shaped holder, the rotating shaft configured to rotate the ring-shaped holder.

8. A ring-shaped holder comprising:
   an outer portion having ring-shape; and
   an inner portion having ring-shape, the inner portion having a substrate mounting surface positioned below an upper surface of the outer portion, the substrate mounting surface being a curved surface, the curved surface having convex regions and concave regions repeated in a circumferential direction, and the curved surface having six-fold rotational symmetry.

9. The ring-shaped holder according to claim 8,
   wherein the inner portion has a ring-shaped groove provided between the substrate mounting surface and the outer portion.

10. The ring-shaped holder according to claim 8,
    wherein the inner portion has a plurality of protrusions protruding from an inner sidewall of the outer portion.

11. The ring-shaped holder according to claim 8,
    wherein a difference in height between a highest portion of the convex region and a lowest portion of the concave region is equal to or greater than 10 µm and equal to or less than 100 µm.

12. The ring-shaped holder according to claim 8,
    wherein the substrate mounting surface has a sine-wave shape.

13. The ring-shaped holder according to claim 8, further comprising:
    an alignment mark provided on the upper surface of the outer portion at a position corresponding to a lowest portion of the concave region.

* * * * *